United States Patent
Shinjo et al.

[11] Patent Number: 5,514,469
[45] Date of Patent: May 7, 1996

[54] MAGNETORESISTANCE EFFECT ELEMENT

[75] Inventors: Teruya Shinjo, Uji; Hidefumi Yamamoto, Kobe; Toshihiko Anno; Toshio Takada, both of Kyoto, all of Japan

[73] Assignees: Ube Industries, Ltd., Yamaguchi; Kanegafuchi Chemical Industry Co., Ltd., Osaka; Nippon Steel Corporation; TDK Corporation, both of Tokyo; Tosoh Corporation, Yamaguchi; Toyo Boseki Kabushiki Kaisha, Osaka; Japan Energy Corporation; NEC Corporation, both of Tokyo; Matsushita Electric Industrial Co., Ltd., Osaka; Seisan Kaihatsu Kagaku Kenkyusho, Kyoto, all of Japan

[21] Appl. No.: 373,462

[22] Filed: Jan. 17, 1995

Related U.S. Application Data

[63] Continuation of Ser. No. 961,314, Oct. 15, 1992, abandoned.

[30] Foreign Application Priority Data

Oct. 23, 1991 [JP] Japan .................... 3-275354

[51] Int. Cl.$^6$ .................. G11B 5/66; B32B 5/16; B32B 15/00
[52] U.S. Cl. .................. 428/332; 428/336; 428/611; 428/666; 428/667; 428/692; 428/694 R; 428/694 T; 428/694 TS; 428/694 TM; 428/900
[58] Field of Search .................. 428/611, 692, 428/694 R, 694 T, 694 TS, 694 TM, 900, 666, 667, 332, 336

[56] References Cited

U.S. PATENT DOCUMENTS

| | | | |
|---|---|---|---|
| 4,663,685 | 5/1987 | Tsang | 360/113 |
| 5,001,586 | 3/1991 | Aboaf et al | 360/113 |

FOREIGN PATENT DOCUMENTS

| | | |
|---|---|---|
| 0503499 | 6/1992 | European Pat. Off. . |
| 0503499A1 | 9/1992 | European Pat. Off. . |
| WO9118424 | 11/1992 | WIPO . |

OTHER PUBLICATIONS

Satoru et al., Patent Abstracts of Japan, vol. 16, No. 236 (E-1210) May 1992.

*Primary Examiner*—Leszek Kilman
*Attorney, Agent, or Firm*—Wenderoth, Lind & Ponack

[57] ABSTRACT

A magnetoresistance effect element having a substrate, a buffer layer of a metal selected from the group consisting of chromium, tungsten, titanium, vanadium, manganese and their alloys which is formed on the substrate, and at least two magnetic thin layers which are laminated with interposing a non-magnetic thin layer therebetween on the metal thin layer, wherein adjacent magnetic thin layers through the non-magnetic thin layer have different coercive forces. This magnetoresistance effect element has an increased magnetoresistance ratio.

9 Claims, 4 Drawing Sheets

MAGNETORESISTANCE EFFECT ELEMENT

This application is a continuation of now abandoned application, Ser. No. 07/961,314 filed Oct. 15, 1992.

BACKGROUND OF THE INVENTION

1. Field of the Invention

The present invention relates to a magnetoresistance effect element for reading a magnetic field intensity as a signal in a magnetic recording medium and the like.

A highly practical magnetoresistance effect element is required to have a large resistance change in a small external magnetic field. The magnetoresistance effect element of the present invention has a large resistance change in a small external magnetic field and can be practically used.

2. Description of the Related Art

In these years, a sensitivity of a magnetic sensor and a density of magnetic recording have been increased. With such increase, a magnetoresistance effect magnetic sensor (hereinafter referred to as "MR sensor") and a magnetoresistance effect magnetic head (hereinafter referred to as "MR head") have been vigorously developed. The MR sensor and head read an external magnetic signal through the resistance change in a reading sensor part comprising a magnetic material. Since a relative speed of the MR sensor or head with a magnetic recording medium does not depend on a reproducing output, a high sensitivity is achieved by the MR sensor and a high output is obtained by the MR head even in case of a high density magnetic recording.

However, with a MR sensor which comprises a conventional magnetic substance utilizing anisotropic magnetoresistance effect such as $Ni_{0.8}Fe_{0.2}$, a magnetoresistance ratio $\Delta R/R$ (which will be defined below) is only about 2 to 5%. Then, a MR element having a larger magnetoresistance ratio is desired.

Recently, it was found that an artificial superlattice film in which directions of magnetization in adjacent magnetic layers are opposite such as $[Fe/Cr]_N$ induces a large magnetoresistance effect (Phys. Rev. Lett., 61, 2472 (1988)). However, with this artificial superlattice film, an external magnetic field at which the maximum resistance change is achieved is very large, namely from ten several KOe to several ten KOe. Therefore, this artificial lattice film as such cannot be practically used.

As described above, the conventional MR sensor and head have a small resistance change, and the conventional artificial superlattices such as Fe/Cr require too large external magnetic field to induce the resistance change.

The present inventors invented, as a magnetoresistance effect element which solves the above problems, a magnetoresistance effect element comprising a substrate and at least two magnetic thin layers which are laminated with interposing a non-magnetic thin layer therebetween on said substrate, wherein adjacent magnetic thin layers through the non-magnetic thin layer have different coercive forces, and filed the patent applications (Japanese Patent Application No. 3-78824 and PCT/JP91/00671 (WO91/18424) corresponding to U.S. Ser. No. 07/820,866 and EP-A-0 483 373).

However, since the magnetoresistance effect element of the above prior application has insufficient smoothness of each layer, when a thickness of the non-magnetic thin layer is reduced, the resistance change is decreased and the mechanical strength is deteriorated.

SUMMARY OF THE INVENTION

An object of the present invention is to improve the smoothness of each layer of the magnetoresistance effect element of the above prior application and increase the magnetoresistance ratio of the magnetoresistance effect element.

This object is achieved by the lamination of a buffer layer of a certain metal on the substrate.

According to the present invention, there is provided a magnetoresistance effect element comprising a substrate, a buffer layer of a metal selected from the group consisting of chromium, tungsten, titanium, vanadium, manganese and their alloys which is formed on said substrate, and at least two magnetic thin layers which are laminated with interposing a non-magnetic thin layer therebetween on said metal thin layer, wherein adjacent magnetic thin layers through the non-magnetic thin layer have different coercive forces.

Preferably, each of the magnetic thin layers and the non-magnetic layer has a thickness of not larger than 200 Å.

DETAILED DESCRIPTION OF THE INVENTION

Figure 1:
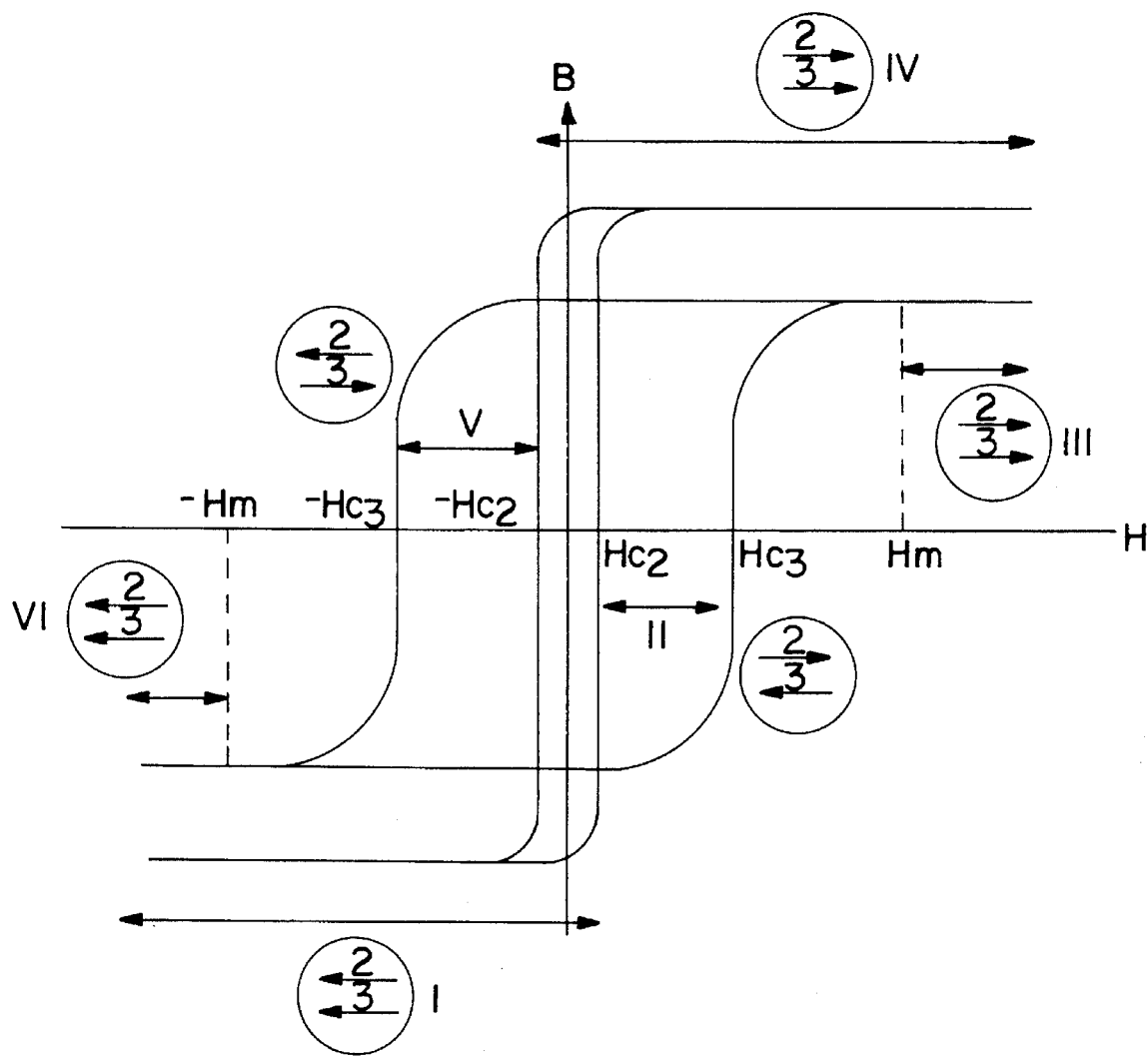
FIG. 1 is a schematic B-H curve which illustrates a function of the magnetoresistance effect element according to the present invention.

In the magnetoresistance effect element of the present invention, it is essential that the adjacent magnetic thin layers through the non-magnetic thin layer have different coercive forces, because the principle of the present invention is based on the fact that, when the directions of the magnetization in the adjacent magnetic layers are different, conduction electrons are scattered depending on spins so that the resistance increases, and when the directions of the magnetization are opposite, the element has the largest resistance. That is, in the present invention, as shown in FIG. 1, when an external field is between a coercive force $Hc_2$ of one magnetic thin layer and a coercive force $Hc_3$ of another magnetic thin layer ($Hc_2 < H < Hc_3$), the directions of the magnetization in the adjacent magnetic layers are opposite so that the resistance increases.

A kind of the magnetic substance to be used as the magnetic thin layer according to the present invention is not limited. Preferred examples are Fe, Ni, Co, Mn, Cr, Dy, Er, Nd, Tb, Tm, Ce and Gd. As alloys or compounds comprising such element, Fe—Si, Fe—Ni, Fe—Co, Fe—Gd, Fe—Al—Si (Sendust, etc.), Fe—Y, Fe—Mn, Cr—Sb, Co base amorphous alloys, Co—Pt, Fe—Al, Fe—C, Mn—Sb, Ni—Mn, Co—O, Ni—O, Fe—O, Ni—F, ferrites and the like are preferred.

In the present invention, two or more magnetic substances having different coercive forces are selected from the above substances to form the magnetic thin layers.

The upper limit of each magnetic thin layer is 200 Å, while the lower limit of the layer thickness is not specifically limited. However, when the layer thickness is less than 4 Å, a Curie temperature is lower than room temperature so that the element cannot be practically used. When the layer thickness is 4 Å or larger, the layer thickness can be easily made uniform, a layer quality is improved and saturation magnetization is not excessively decreased. Though the effect is not deteriorated when the layer thickness is larger than 200 Å, it is not increased as the layer thickness increases, and the production of such thick layer is wasteful and uneconomical.

The coercive force of each magnetic layer varies with the strength of the external magnetic field applied to the element or the required resistance change rate and is selected from the range between about 0.001 Oe and about 10 kOe. A ratio of the coercive forces of the adjacent magnetic layers is from 1.2:1 to 100:1, preferably from 5:1 to 50:1, more preferably from 8:1 to 20:1.

Since the magnetic characteristics of each magnetic thin layer present in the magnetoresistance effect element cannot be directly measured, in general, they are measured as follows:

The magnetic thin layers to be measured are vapor deposited alternately with the non-magnetic thin layers till the total thickness reaches about 200 to 400 Å to produce a sample for measurement, and its magnetic characteristics are measured. In this case, the thickness of each magnetic thin layer, the thickness of each non-magnetic layer and the composition of the non-magnetic layer are the same as those in the magnetoresistance effect element.

The magnetic characteristics of the magnetic thin layer other than the coercive force are not critical. A squareness ratio of the magnetic thin layer having a small coercive force is preferably from 0.9 to 1.0.

The non-magnetic layer acts as a material for decreasing a magnetic interaction between the magnetic thin layers having the different coercive forces and its kind is not limited. The non-magnetic material can be selected from various metallic or semimetallic non-magnetic materials or non-metallic non-magnetic materials.

Preferred examples of the metallic non-magnetic material are Au, Ag, Cu, Pt, Al, Mg, Mo, Zn, Nb, Ta, V, Hf, Sb, Zr, Ga, Ti, Sn, Pb or their alloys. Preferred examples of the semimetallic non-magnetic material are Si, Ge, C, B and a composite material of at least one of these element and other element. Preferred examples of the non-metallic non-magnetic material are $SiO_2$, SiO, SiN, $Al_2O_3$, ZnO, MgO, TiN or a composite material of at least one of these materials and other element.

A thickness of the non-magnetic thin layer is not larger than 200 Å. When this thickness exceeds 200 Å, the strength of the resistance is determined by the non-magnetic layer(s), so that the scattering effect depending on the magnetic spins is relatively reduced and then the magnetoresistance change rate is decreased. When this thickness is smaller than 4 Å, the magnetic interaction between the magnetic thin layers becomes too large and generation of the direct magnetically contacting state (pin holes) is unavoidable, so that it is difficult to differentiate the directions of the magnetization of the magnetic thin layers.

In the magnetoresistance effect element of the present invention, a thin film of a specific metal is formed on the substrate surface. When the element is formed directly on the substrate, a bonding force of the element to the substrate is small so that the mechanical strength of the layers is decreased. When the element is formed on the buffer layer which is formed on the substrate, the mechanical strength of the element is considerably increased. In addition, an interface between the layers requires smoothness. When the buffer layer is formed on the substrate, this smoothness is realized.

A material of the buffer layer is selected from the group consisting of chromium, tungsten, titanium, vanadium, manganese and their alloys. Among them, chromium, titanium and vanadium are preferred.

A thickness of the buffer layer is not critical. Usually, the thickness of the metal thin film is not larger than 200 Å, preferably from 20 to 150 Å, in particular, from 30 to 100 Å. When the thickness of the buffer layer is 200 Å or less, the MR ratio is not deteriorated substantially.

The thickness of each of the buffer layer, magnetic and non-magnetic thin layers can be measured by a transmittance electron microscope, a scanning electron microscope, Auger electron spectroscopy and the like. A crystal structure of the thin layer can be identified by X-ray diffraction, reflection high-energy electron diffraction (RHEED) and the like.

In the magnetoresistance effect element according to the present invention, the number of the laminated artificial superlattice layers N is not critical, and is determined according to the desired magnetoresistance change and the like. To obtain a sufficient magnetoresistance change, N is preferably at least 3. As the number of the laminated layers increases, the resistance change rate increases though the productivity decreases. When N is too large, the resistance of the whole element excessively decreases so that the practical use of the element may be difficult. In general, N is 50 or less.

In the above explanation, two magnetic thin layers having different coercive forces are used. It is possible to use three or more magnetic thin layers having different coercive forces, whereby two or more external magnetic fields at which the directions of the magnetization are inverted can be set, so that a range of acting magnetic field strength can be increased.

On the surface of the uppermost magnetic thin layer, an oxidation-inhibiting film made of, for example, silicon nitride or silicon oxide may be provided, or a metallic conductive film for the formation of an electrode may be provided.

The thin layer may be formed by vapor deposition, sputtering, molecular beam epitaxy (MBE) and the like. As the substrate, glass, silicon, MgO, GaAs, ferrite, CaTiO and the like can be used.

Now, the relationship among the external magnetic field, the coercive force and the directions of the magnetization is explained.

For simplicity, the explanation will be made by making reference to an element containing two magnetic thin layers (2) and (3) having different coercive forces.

As shown in FIG. 1, the coercive forces Hc of two magnetic layers are $Hc_2$ and $Hc_3$ ($0<Hc_2<Hc_3$). First, the external magnetic field H is applied so that H is smaller than $-Hcm$ (Hcm being an eternal magnetic field at which the magnetization of the magnetic thin layer (3) is saturated). The directions of the magnetization of the magnetic thin layers (2) and (3) are in the same negative (−) direction as that of H. As the external magnetic field is increased, in the region I wherein $H<Hc_2$, the directions of the magnetizations of the both magnetic thin layers are still in the negative direction.

The external magnetic field is increased to the region II wherein $Hc_2<H<Hc_3$, the direction of the magnetization of the magnetic thin layer (2) is inverted so that the directions of the magnetization of the magnetic thin layers (2) and (3) are opposite. When the external magnetic field is further increased to the region III wherein Hcm< H, the directions of the magnetization of the magnetic thin layers (2) and (3) are both in the positive (+) direction.

Thereafter, when the external magnetic field H is decreased, in the region IV wherein $-Hc_2<H$, the directions of the magnetization of the both magnetic thin layers (2) and (3) are still in the positive direction, but in the region V wherein $-Hc_3<H<-Hc_2$, the direction of the magnetization of the magnetic thin layer (2) is inverted to the negative direction so that the directions of the magnetization of the magnetic thin layers (2) and (3) are opposite. Further, in the region VI wherein $H<-Hcm$, the directions of the magnetization of the magnetic thin layers (2) and (3) are both in the negative direction. In the regions II and V wherein the directions of the magnetization of the magnetic thin layers (2) and (3) are opposite, the conduction electrons are scattered depending on the spins so that the resistance increases.

For example, when $Ni_{0.8}Fe_{0.2}$ having a small Hc ($Hc_2$ of about several Oe) is selected as a material for the magnetic thin layer (2) and Co having a slightly larger Hc ($Hc_3$ of several ten Oe) is selected as a material for the magnetic thin layer (3), it is possible to provide a MR element which has the large resistance change at a small external magnetic field around the external magnetic field $Hc_2$.

EXAMPLES

The magnetoresistance effect element of the present invention will be illustrated by making reference to the accompanying drawing.

Figure 2:
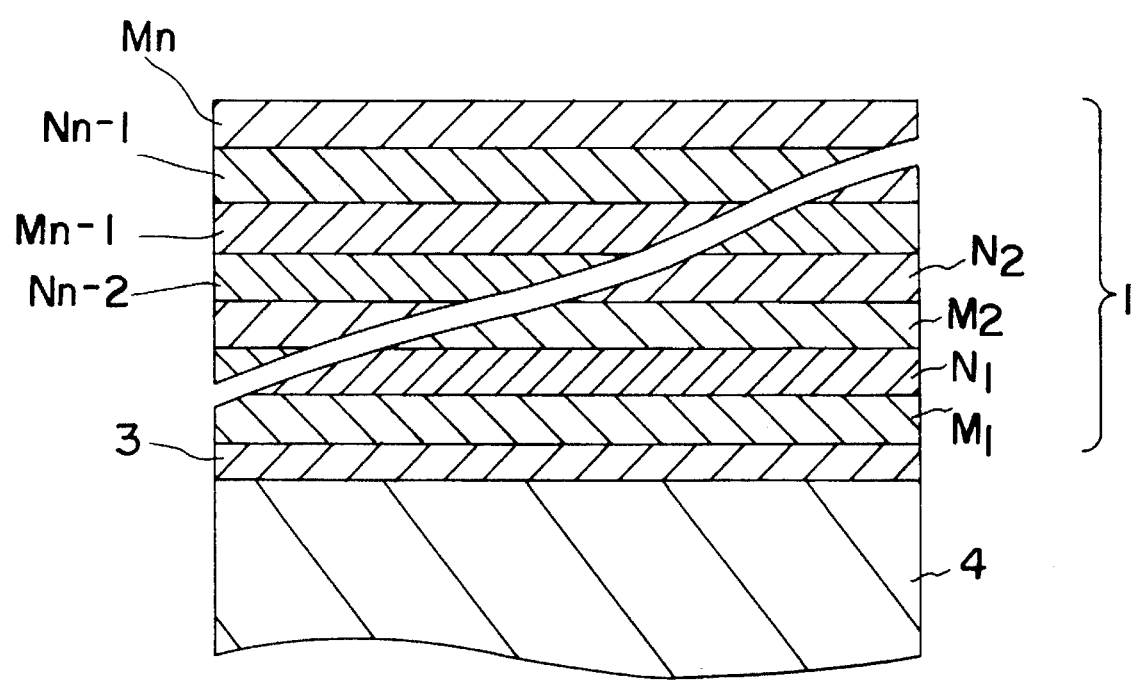
FIG. 2 is a partly omitted cross section of a magnetoresistance effect element according to the present invention.

FIG. 2 is a cross section of an example of the artificial super lattice film 1 of the present invention. In FIG. 2, the artificial super lattice film 1 has magnetic thin layers $M_1$, $M_2$, ..., $M_{n-1}$ and $M_n$ on a substrate 4 on which a buffer layer 3 has been formed and, between adjacent two magnetic layers, non-magnetic thin layers $N_1, N_2, \ldots, N_{n-2}$ and $N_{n-1}$.

The present invention will be explained by the experimental results.

Example 1

A glass plate 4 as a substrate was placed in a high vacuum deposition apparatus and the apparatus was evacuated to $10^{-9}$–$10^{-10}$ Torr. While rotating the substrate which was kept at room temperature, a chromium thin film having a thickness of 50 Å was formed and then an artificial super lattice film 1 having the following composition was formed. While applying a magnetic field in an area of the substrate, the film was grown at a rate of about 0.3 k/sec.

The compositions and the magnetoresistance change rates of the multilayer films consisting of the magnetic thin layers and the non-magnetic thin layers are shown in Table 1. In Table 1, when the composition is expressed, for example, as [NiFe(10)/Cu(t)/Co(10)/Cu(t)]×5, it means that a thin layer of an alloy of 80% Ni and 20% Fe having a thickness of 10 Å, a Cu thin layer having a thickness of t Å, a Co thin layer having a thickness of 10 Å and a Cu thin layer having a thickness of t Å were successively deposited and the deposition of these layers was repeated five times. As shown in Table 1, "t" was changed between 12 and 68 Å.

The magnetization was measured by a vibrating sample magnetometer. The dimension of the sample for MR measurement, which had the composition shown in Table 1, was 0.3×10 mm. While applying the external magnetic field in an in-plane direction perpendicular to a direction of an electric current, the resistance was measured by a four prove method by changing the external field from −500 Oe to +5000 Oe, and the magnetoresistance ratio ΔR/R was calculated from the measured resistances. The magnetoresistance ratio ΔR/R was calculated according to the following equation:

$$\frac{\Delta R}{R} = \frac{Rmax - Rmin}{Rmin} \times 100 \, (\%)$$

wherein Rmax is the maximum resistance and Rmin is the minimum resistance.

For comparison, the multilayer film was formed without forming any metal thin film on the substrate and a magnetoresistance ratio was calculated.

Figure 3:
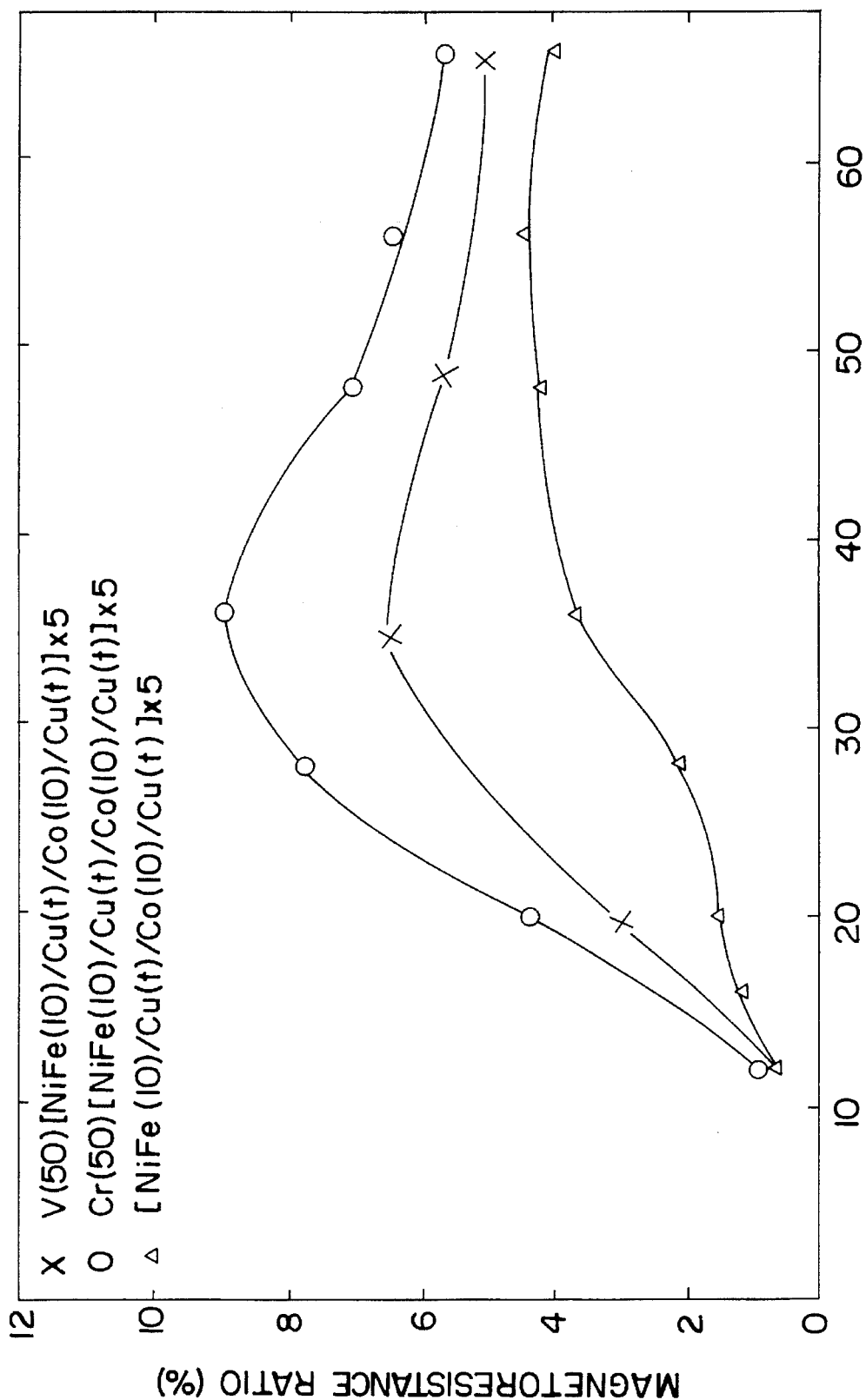
FIG. 3 is a graph showing B-H curves of the magnetoresistance effect elements produced in Examples 1 and 3 and Comparative Example 1.

The results are shown in Table 1 and FIG. 3.

TABLE 1

| Composition of artificial superlattice film | ΔR/R (%) |
|---|---|
| Comparative Example 1 (without a chromium thin film) | |
| [NiFe(10)/Cu(12)/Co(10)/Cu(12)] × 5 | 0.65 |
| [NiFe(10)/Cu(16)/Co(10)/Cu(16)] × 5 | 1.18 |
| [NiFe(10)/Cu(20)/Co(10)/Cu(20)] × 5 | 1.50 |
| [NiFe(10)/Cu(28)/Co(10)/Cu(28)] × 5 | 2.13 |
| [NiFe(10)/Cu(36)/Co(10)/Cu(36)] × 5 | 3.69 |
| [NiFe(10)/Cu(48)/Co(10)/Cu(48)] × 5 | 4.05 |
| [NiFe(10)/Cu(56)/Co(10)/Cu(56)] × 5 | 4.20 |
| [NiFe(10)/Cu(68)/Co(10)/Cu(68)] × 5 | 4.10 |
| Example 1 (with a chromium thin film) | |
| Cr(50)[NiFe(10)/Cu(12)/Co(10)/Cu(12)] × 5 | 0.93 |
| Cr(50)[NiFe(10)/Cu(16)/Co(10)/Cu(16)] × 5 | — |
| Cr(50)[NiFe(10)/Cu(20)/Co(10)/Cu(20)] × 5 | 4.36 |
| Cr(50)[NiFe(10)/Cu(28)/Co(10)/Cu(28)] × 5 | 7.71 |
| Cr(50)[NiFe(10)/Cu(36)/Co(10)/Cu(36)] × 5 | 9.17 |
| Cr(50)[NiFe(10)/Cu(48)/Co(10)/Cu(48)] × 5 | 7.03 |
| Cr(50)[NiFe(10)/Cu(56)/Co(10)/Cu(56)] × 5 | 6.44 |
| Cr(50)[NiFe(10)/Cu(68)/Co(10)/Cu(68)] × 5 | 5.69 |
| Cr(50)[NiFe(10)/Cu(36)/Co(10)/Cu(36)] × 20 | 13.00 |

Example 2 and Comparative Example 2

In the same manner as in Example 1, multilayer films having the following compositions were produced Cr(50)[NiFe(25)/Ag(70)/Co(25)/Ag(70)]×N (N=2 to 15) and the magnetoresistance ratios were calculated.

For comparison, a multilayer film having the same composition as above but including no Cr thin film was produced and a magnetoresistance ratio was calculated.

Figure 4:
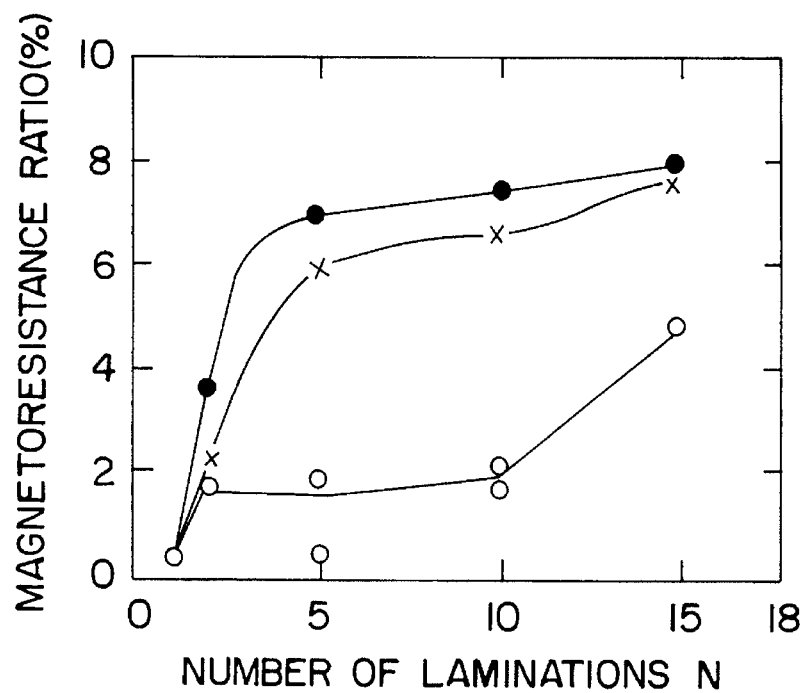
FIG. 4 is a graph showing B-H curves of the magnetoresistance effect elements produced in Examples 2 and 4 and Comparative Example 2.

The results are shown in Table 2 and FIG. 4.

TABLE 2

| | Magnetoresistance ratio (%) | |
|---|---|---|
| N | Example 2 | Comp. Ex. 2 |
| 2 | 3.7 | 1.8 |
| 5 | 7.1 | 1.9 |
| 10 | 7.4 | 2.0 |
| 15 | 8.0 | 4.8 |

Example 3

In the same manner as in Example 1 but using vanadium in place of chromium, a multilayer film was produced and its magnetoresistance ratio was calculated. The results are shown in FIG. 3.

Example 4

In the same manner as in Example 1 but using titanium in place of chromium, a multilayer film was produced and its magnetoresistance ratio was calculated. The results are shown in FIG. 4.

What is claimed is:

1. A magnetoresistance effect element comprising a substrate, a buffer layer of a metal selected from the group consisting of chromium, tungsten, titanium, vanadium, manganese and their alloys which is formed on said substrate, and repeated unit multilayers, each unit having at least two magnetic thin layers which are laminated with interposing a non-magnetic thin layer therebetween on said metal thin layer, wherein adjacent magnetic thin layers having the non-magnetic thin layer interposed therebetween have different coercive forces, and the number of said unit multilayers is from 3 to 50.

2. The magnetoresistance effect element according to claim 1, wherein each of said buffer layer of the metal, said magnetic thin layers and said non-magnetic layer has a thickness of not larger than 200 Å.

3. The magnetoresistance effect element according to claim 1, wherein each of said magnetic thin layers is formed from at least one magnetic substance selected from the group consisting of Fe, Ni, Co, Mn, Cr, Dy, Er, Nd, Tb, Tm, Ce, Gd and their alloys and compounds.

4. The magnetoresistance effect element according to claim 3, wherein said alloys and compounds are selected from the group consisting of Fe—Si, Fe—Ni, Fe—Co, Fe—Gd, Fe—Al—Si, Fe—Y, Fe—Mn, Cr—Sb, Co base amorphous alloys, Co—Pt, Fe—Al, Fe—C, Mn—Sb, Ni—Mn, Co—O, Ni—O, Fe—O, Ni—F and ferrites.

5. The magnetoresistance effect element according to claim 1, wherein each of said magnetic thin layers has a thickness of at least 4 Å.

6. The magnetoresistance effect element according to claim 1, wherein said non-magnetic thin layer is formed from at least one metallic non-magnetic material selected from the group consisting of Au, Ag, Cu, Pt, Al, Mg, Mo, Zn, Nb, Ta, V, Hf, Sb, Zr, Ga, Ti, Sn, Pb and their alloys.

7. The magnetoresistance effect element according to claim 1, wherein said non-magnetic thin layer is formed from at least one-semimetallic non-magnetic material selected from the group consisting of Si, Ge, C, B and a composite material of at least one of these elements.

8. The magnetoresistance effect element according to claim 1, wherein said non-magnetic thin layer is formed from at least one non-metallic non-magnetic material selected from the group consisting of $SiO_2$, SiO, SiN, $Al_2O_3$, ZnO, MgO, TiN and a composite material of at least one of these materials.

9. The magnetoresistance effect element according to claim 1, wherein said non-magnetic thin layer has a thickness of at least 4 Å.

* * * * *